（12）United States Patent
Nakashima et al.

(10) Patent No.: US 10,605,837 B2
(45) Date of Patent: Mar. 31, 2020

(54) ABNORMALITY DIAGNOSIS APPARATUS

(71) Applicant: DENSO CORPORATION, Kariya, Aichi-pref. (JP)

(72) Inventors: Kotaro Nakashima, Kariya (JP); Takashi Suzuki, Kariya (JP); Masaya Taki, Kariya (JP); Yohei Kaneda, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 212 days.

(21) Appl. No.: 15/902,385

(22) Filed: Feb. 22, 2018

(65) Prior Publication Data

US 2018/0238935 A1    Aug. 23, 2018

(30) Foreign Application Priority Data

Feb. 23, 2017    (JP) .................................. 2017-031973

(51) Int. Cl.
| | | |
|---|---|---|
| *G01R 19/03* | (2006.01) | |
| *G01R 19/00* | (2006.01) | |
| *G01R 31/327* | (2006.01) | |
| G01R 31/00 | (2006.01) | |
| G01R 31/40 | (2020.01) | |

(52) U.S. Cl.
CPC ....... *G01R 19/003* (2013.01); *G01R 31/3278* (2013.01); *G01R 31/006* (2013.01); *G01R 31/40* (2013.01)

(58) Field of Classification Search
CPC .... G01R 19/03; G01R 19/003; G01R 31/006; G01R 31/40

USPC ....................................................... 714/47.1
See application file for complete search history.

(56) References Cited

U.S. PATENT DOCUMENTS

| | | | | |
|---|---|---|---|---|
| 8,958,951 | B2* | 2/2015 | Mikamo | B62D 5/0463 |
| | | | | 701/41 |
| 2012/0161681 | A1* | 6/2012 | Kuroda | B62D 5/0481 |
| | | | | 318/400.21 |
| 2013/0116875 | A1* | 5/2013 | Oh | B60L 15/2045 |
| | | | | 701/22 |

(Continued)

FOREIGN PATENT DOCUMENTS

| | | |
|---|---|---|
| JP | 2009-189209 | 8/2009 |
| JP | 2011-182492 | 9/2011 |

(Continued)

*Primary Examiner* — Kamini B Patel
(74) *Attorney, Agent, or Firm* — Knobbe, Martens, Olson & Bear, LLP

(57) ABSTRACT

An abnormality diagnosis apparatus performs: a first step of diagnosing a shortage of precharge voltage or a short-circuit failure between electrodes of a capacitor based on a detection value of a precharge voltage detection circuit in a state where a first relay and a second relay are turned off, and a precharge circuit is operated; a second step of diagnosing, after a normal determination in the first step, a disconnection failure of a precharge path based on the detection value of the precharge voltage detection circuit or a detection value of an inter-relay voltage detection circuit in a state where the first relay and the second relay are turned off, and the precharge circuit is not operated; and a relay failure diagnosis step of diagnosing, after a normal determination in the second step, a short-circuit failure and an open failure of the first relay or the second relay.

3 Claims, 6 Drawing Sheets

(56) References Cited

U.S. PATENT DOCUMENTS

2015/0054517 A1\* 2/2015 Yonezaki ........... G01R 31/3278
324/418
2017/0131378 A1\* 5/2017 Murata .................. B60L 58/10

FOREIGN PATENT DOCUMENTS

| JP | 2014-139058 | 7/2014 |
| JP | 2015-107045 | 6/2015 |

\* cited by examiner

FIG.4

| STEP | FAILURE MODE | OPERATION | | | DETERMINATION VALUE | ABNORMALITY DETERMINATION CONDITION | THEORETICAL VALUE | |
|---|---|---|---|---|---|---|---|---|
| | | FIRST RELAY | SECOND RELAY | PRECHARGE | | | ABNORMAL TIME | NORMAL TIME |
| 1 | INSUFFICIENT PRECHARGE VOLTAGE CAPACITOR SHORT-CIRCUIT | OFF | OFF | ON | Vp# | <A1 | (0) | $\alpha p \cdot Vp$ |
| 2 | PRECHARGE PATH DISCONNECTION | OFF | OFF | OFF | Vp# | <B1 | 0 | $\alpha p \cdot Vp$ |
| 3 | FIRST RELAY SHORT-CIRCUIT / SECOND RELAY SHORT-CIRCUIT | OFF | OFF | ON | Vm# | >C1 | $\alpha m \cdot Vb$ / $\alpha m \cdot Vp$ | RESIDUAL VOLTAGE |
| 4 | SECOND RELAY OPEN | OFF | ON | ON | Vm# | <D1 | RESIDUAL VOLTAGE | $\alpha m \cdot Vp$ |
| 5 | FIRST RELAY OPEN | ON | OFF | ON or OFF | Vm# | <E1 | $\alpha m \cdot Vp$ | $\alpha m \cdot Vb$ |

$$\alpha p = \frac{Rpd}{Rpd+Rpu}$$

$$\alpha m = \frac{Rmd}{Rmd+Rmu}$$

| STEP | FAILURE MODE | OPERATION | | | DETERMINATION VALUE | ABNORMALITY DETERMINATION CONDITION | THEORETICAL VALUE | | |
| --- | --- | --- | --- | --- | --- | --- | --- | --- | --- |
| | | FIRST RELAY | SECOND RELAY | PRECHARGE | | | ABNORMAL TIME | | NORMAL TIME |
| 1 | INSUFFICIENT PRECHARGE VOLTAGE CAPACITOR SHORT-CIRCUIT | OFF | OFF | ON | Vp# | <A2 | (0) | < | $\alpha p \cdot Vp$ |
| 2 | PRECHARGE PATH DISCONNECTION | OFF | OFF | OFF | Vm# | <B2 | 0 | < | $\beta m \cdot Vp$ |
| 3 | FIRST RELAY SHORT-CIRCUIT | OFF | OFF | ON | Vm# | >C2 | $\alpha m \cdot Vb$ | > | $\beta m \cdot Vp$ |
| | SECOND RELAY SHORT-CIRCUIT | | | | | | $\alpha m \cdot Vp$ | > | |
| 4 | SECOND RELAY OPEN | OFF | ON | ON | Vm# | <D2 | $\beta m \cdot Vp$ | < | $\alpha m \cdot Vp$ |
| 5 | FIRST RELAY OPEN | ON | OFF | ON or OFF | Vm# | <E2 | $\beta m \cdot Vp$ | < | $\alpha m \cdot Vb$ |

$$\alpha p = \frac{Rpd}{Rpd+Rpu}$$

$$\alpha m = \frac{Rmd}{Rmd+Rmu}$$

$$\beta m = \frac{Rmd}{Rmd+Rmu+R1}$$

$$Vb > Vp$$

ABNORMALITY DIAGNOSIS APPARATUS

CROSS-REFERENCE TO RELATED APPLICATION

This application is based on and claims the benefit of priority from earlier Japanese Patent Application No. 2017-31973 filed Feb. 23, 2017, the description of which is incorporated herein by reference.

BACKGROUND

Technical Field

The present disclosure relates to an abnormality diagnosis apparatus diagnosing an abnormality of a power supply input circuit and the like.

Conventionally, a power supply input circuit is known in which a power-supply relay is provided on a power-supply line between a DC power supply and a smoothing capacitor at the input side of an electrical power converter, and which charges the smoothing capacitor from a precharge circuit in a state where the power-supply relay is closed. In addition, a bidirectional power supply relay is known in which two switching relays each having a freewheel diode that allows a current to flow from the connection side thereof to the opposite side are connected in series.

When a DC power supply is set in a regular direction, the first relay of the bidirectional power supply relay interrupts a current that flows from the DC power supply to an electrical power converter through a power supply line. When the DC power supply is set in a direction opposite to the regular direction, the second relay of the bidirectional power supply relay interrupts a current which flows from the DC power supply to the electrical power converter through a ground line, that is, in the reverse direction.

For example, the motor apparatus disclosed in Japanese Patent No. 5311233 includes a voltage detection means that detects an inter-relay voltage between a first relay and a second relay for a initial check. In the first step after charging a capacitor by a precharge circuit, a short-circuit failure of at least one of the first relay and the second relay is diagnosed based the inter-relay voltage, in a state where the first relay and the second relay are turned off. In the second and third steps, an open failure of the first relay and the second relay is diagnosed based on the inter-relay voltage in a state where one of the first relay and the second relay is turned off and the other is turned on.

According to Japanese Patent No. 5311233, the failure diagnosis of the first relay and the second relay is conducted assuming that charging the capacitor by the precharge circuit has been conducted normally. However, in cases of an abnormality in which the precharge circuit does not operate normally, whereby the precharge voltage is insufficient, a disconnection failure of a precharge path from the precharge circuit to a power line occurs, and a short-circuit failure occurs between electrodes of the capacitor, the capacitor is not charged normally. According to Japanese Patent No. 5311233, such a failure mode is not assumed, and the above abnormalities cannot be diagnosed. In addition, if a failure diagnosis of a bidirectional power supply relay is conducted while the abnormalities are not noticed, erroneous determination may be made.

SUMMARY

An embodiment provides an abnormality diagnosis apparatus that can diagnose a failure of a bidirectional power supply relay after it is determined that a capacitor has been charged by a precharge circuit normally.

As a first aspect of the embodiment, an abnormality diagnosis apparatus is provided which is used for a power supply input circuit in which a first relay, which is a switching element having a freewheel diode allowing a current to flow from an electrical power converter side to a DC power supply side and is connected to the DC power supply side, and a second relay, which is a switching element having a freewheel diode allowing a current to flow from the DC power supply side to the electrical power converter side and is connected to the electrical power converter side, are connected in series on a power supply line that connects a positive electrode of a DC power supply and an electrical power converter, and a high potential side electrode of a capacitor that smooths input voltage of the electrical power converter is connected to the power supply line between the second relay and the electrical power converter or between the first relay and the second relay The apparatus includes: a precharge circuit that generates a desired precharge voltage, that is connected to the high potential side electrode of the capacitor via a precharge path, and that applies the precharge voltage to the high potential side electrode of the capacitor in a state where a path between the DC power supply and the high potential side electrode of the capacitor is interrupted, to charge the capacitor; a precharge voltage detection circuit that detects the precharge voltage output from the precharge circuit; an inter-relay voltage detection circuit that detects an inter-relay voltage that is a voltage of the power supply line between the first relay and the second relay; and a determination section that determines an abnormality regarding a predetermined failure mode based on a detection value of the precharge voltage detection circuit and a detection value of the inter-relay voltage detection circuit.

The apparatus performs: a first step of diagnosing a shortage of the precharge voltage or a short-circuit failure between electrodes of the capacitor based on the detection value of the precharge voltage detection circuit in a state where the first relay and the second relay are turned off, and the precharge circuit is operated; a second step of diagnosing, after a normal determination in the first step, a disconnection failure of the precharge path based on the detection value of the precharge voltage detection circuit or the detection value of the inter-relay voltage detection circuit in a state where the first relay and the second relay are turned off, and the precharge circuit is not operated; and a relay failure diagnosis step of diagnosing, after a normal determination in the second step, a short-circuit failure and an open failure of the first relay or the second relay.

BRIEF DESCRIPTION OF THE DRAWINGS

In the accompanying drawings:

FIG. 4 is diagram showing an abnormality diagnosis method performed by the abnormality diagnosis apparatus of the first embodiment;

FIG. 6 is diagram showing an abnormality diagnosis method performed by the abnormality diagnosis apparatus of the second embodiment.

DETAILED DESCRIPTION OF THE PREFERRED EMBODIMENTS

Hereinafter, a plurality of embodiments of an abnormality diagnosis apparatus will be described with reference to the drawings. The first and the second embodiments are collectively referred to as a present embodiment.

The abnormality diagnosis apparatus of the present embodiment is applied to a motor control apparatus controlling the drive of an assist motor in electric power steering equipment of a vehicle. First, the configuration of the electric power steering equipment common to the embodiments and the schematic configuration of the motor control apparatus will be described.

[Configuration of Electric Power Steering Equipment]

Figure 1:
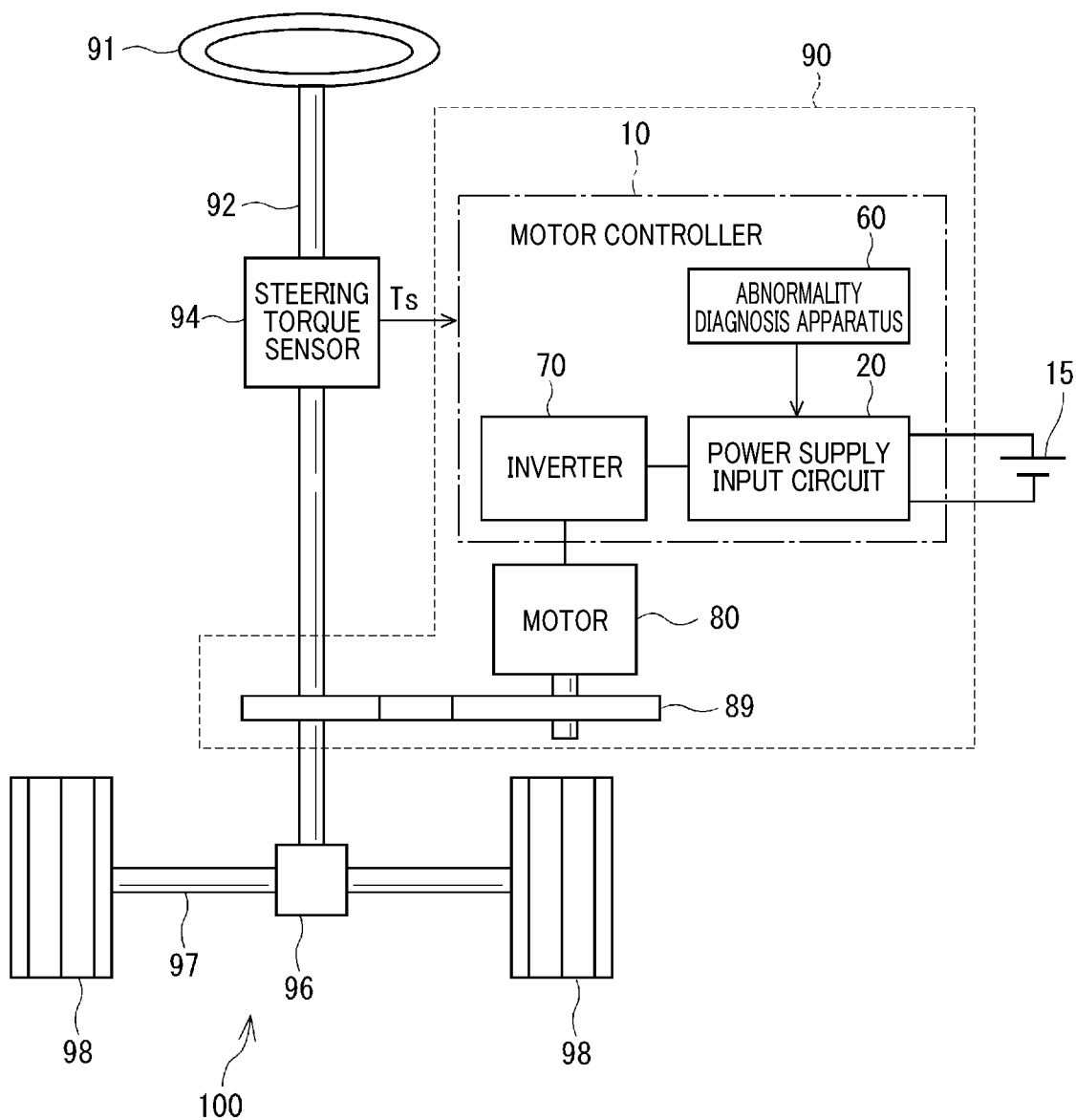
FIG. 1 is a drawing showing the overall configuration of electric power steering equipment to which a motor control apparatus including an abnormality diagnosis apparatus of each embodiment is applied.

FIG. 1 shows the overall configuration of a steering system 100 including electric power steering equipment 90. It is noted that although the electric power steering equipment 90 shown in FIG. 1 is a column assist type, the electric power steering equipment 90 can be similarly applied to a rack assist type electric power steering equipment.

The steering system 100 includes a steering wheel 91, a steering shaft 92, a steering torque sensor 94, a pinion gear 96, a rack shaft 97, wheels 98, and the electric power steering equipment 90.

The steering wheel 91 is connected with the steering shaft 92. The pinion gear 96 provided at the tip of the steering shaft 92 is engaged with the rack shaft 97. The ends of the rack shaft 97 are provided with the pair of wheels 98 via a tie rod and the like. When the driver rotates the steering wheel 91, the steering shaft 92 connected to the steering wheel 91 rotates. The rotational motion of the steering shaft 92 is converted to linear motion of the rack shaft 97 by the pinion gear 96, whereby the pair of wheels 98 is steered at an angle corresponding to the amount of displacement of the rack shaft 97.

The steering torque sensor 94 is provided on steering shaft 92 and detects steering torque Ts generated by the driver.

The electric power steering equipment 90 includes a motor controller 10, a motor 80, and a reduction gear 89. The motor 80 is, for example, a three-phase brushless motor.

The motor controller 10 controls the drive of the motor 80 so as to generate desired assist torque based on the steering torque Ts. Specifically, the motor controller 10 acquires detection values of a motor current and an electrical angle, and drives an inverter 70 serving as an electrical power converter by current feedback control. The inverter 70 converts DC power of a battery 15 serving as a DC power supply to a three-phase AV power, and supplies the three-phase AV power to the motor 80. Since typical motor control is well-known, the detailed description thereof is omitted. Assist torque output by the motor 80 is transmitted to the steering shaft 92 through the reduction gear 89.

The motor controller 10 of the present embodiment includes an abnormality diagnosis apparatus 60 that diagnoses an abnormality of a power supply input circuit 20 provided between the battery 15 and the inverter 70. The abnormality diagnosis apparatus 60 diagnoses, after a vehicle switch is turned on, an abnormality of a power supply relay or the like of the power supply input circuit 20 as an initial check before the drive of the motor starts. The configuration of the abnormality diagnosis apparatus 60 and the method of diagnosing an abnormality will be described later.

[Configuration of Motor Controller]

Figure 2:
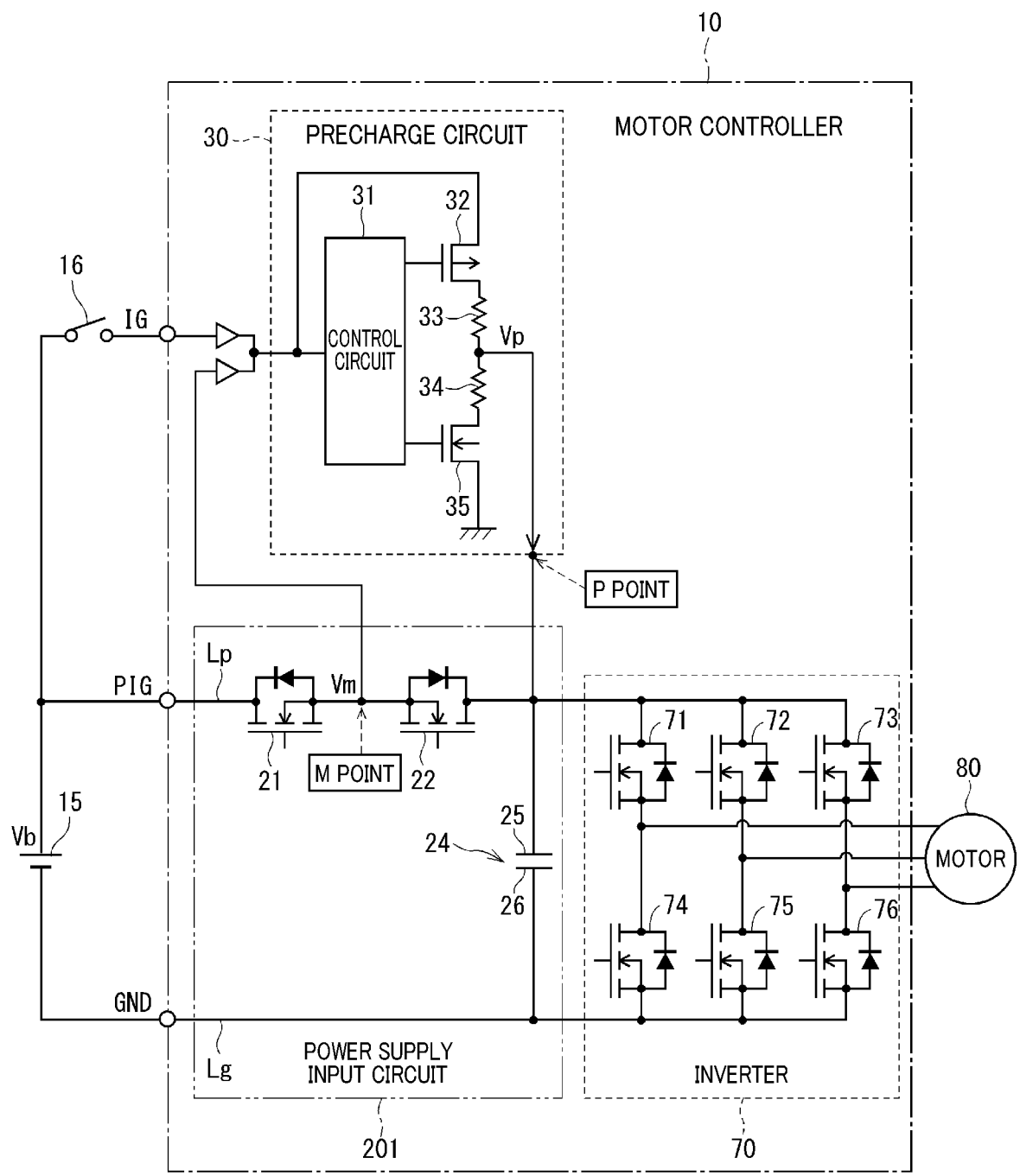
FIG. 2 is a diagram showing configurations of a power supply input circuit, a precharge circuit, and the like of the motor control apparatus shown in FIG. 1.

FIG. 2 shows a schematic configuration of the motor controller 10. Specifically, FIG. 2 relates to a position where a high potential side electrode 25 of a capacitor 24 is connected. The configuration of the first embodiment is shown in FIG. 2. Hence, in the first embodiment, sign "201" denotes the power supply input circuit. It is noted that other components shown in FIG. 2 are common between the first and second embodiments.

In addition, in FIG. 2, an engine vehicle is assumed, and signs "IG" and "PIG" indicating "ignition" are used for input terminals of the motor controller 10. It is noted that, for a hybrid vehicle or the like, IG may be appropriately read as a corresponding term. Hereinafter, the switch provided on an IG line shown in FIG. 2 is referred to as "vehicle switch 16".

The motor controller 10 includes the inverter 70, a power supply input circuit 201, and a precharge circuit 30.

In the inverter 70, six switching elements 71 to 76 of upper and lower arms are subjected to bridge connections. Specifically, the switching elements 71, 72, and 73 are respectively switching elements of U-phase, V-phase, and W-phase of the upper arm, and the switching elements 74, 75, and 76 are respectively switching elements of U-phase, V-phase, and W-phase of the lower arm.

The switching elements 71 to 76 are each configured by, for example, a MOSFET (metal-oxide semiconductors, and are each accompanied with a freewheel diode allowing a current to flow from the low-potential side to the high-potential side. It is noted that, in the MOSFET, the freewheel diode is configured as a parasitic diode inside the element.

The high-potential side of the inverter 70, that is, the drains of the switching elements 71, 72, and 73 of the upper arm are connected to the positive electrode of the battery 15 via a power supply line Lp. The low-potential side of the inverter 70, that is, the sources of the switching elements 74, 75, and 76 of the lower arm are connected to the negative electrode of the battery 15 via a ground line Lg.

The power supply input circuit 201 includes a first relay 21 and a second relay 22 that configure a bidirectional power supply relay and a capacitor 24 that smooths input voltage applied to the inverter 70.

The first relay 21 and the second relay 22 are connected in series on the power supply line Lp. The first relay 21 provided at the battery 15 side is a switching element that has a freewheel diode allowing a current to flow from the inverter 70 side to the battery 15 side.

The second relay 22 provided at the inverter 70 side is a switching element that has a freewheel diode allowing a current to flow from the battery 15 side to the inverter 70 side.

In the present embodiment, the first relay 21 and the second relay 22 are each configured by a MOSFET, and the freewheel diode is configured as a parasitic diode inside the element. However, in other embodiment, the first relay 21 and the second relay 22 may be each configured by connecting a diode element to a switching element such as an IGBT (insulated gate bipolar transistor) in parallel.

When the battery 15 is connected in the regular direction, the first relay 21 interrupts a current flowing from the battery 15 to the inverter 70 through the power supply line Lp.

When the second 22 is connected in the direction opposed to the regular direction, the second relay 22 interrupts a current flowing from the battery 15 to the inverter 70 through the ground line, that is, in the reverse direction. The second relay 22 is referred to as a reverse connection protection relay or a reverse connection prevention relay.

Here, the point between the first relay 21 and the second relay 22 on the power supply line Lp is defined as an M point.

One of the two electrodes of the capacitor 24, which is connected to the power supply line Lp, is referred to as the high potential side electrode 25. The other of the two electrodes of the capacitor 24, which is connected to the ground line Lg, is referred to as a low potential side electrode 26. It is noted that the capacitor 24 is not limited to an electrolytic capacitor having polarity but may be a non-polar capacitor. In the case of the non-polar capacitor, the terms, high potential side electrode 25 and low potential side electrode 26, are used for merely identifying the placements thereof in the circuit to which they are connected.

The precharge circuit 30 can generate a desired precharge voltage Vp by circuit operation. Before the drive of the motor 80 starts, in a state where the path between the battery 15 and the high potential side electrode 25 of the capacitor 24 is interrupted, the precharge circuit 30 applies the precharge voltage Vp to the high potential side electrode 25 of the capacitor 24, thereby charging the capacitor 24. It is noted that the state where the path between the battery 15 and the high potential side electrode 25 of the capacitor 24 is interrupted is a state where at least the first relay 21 is turned off.

For example, the precharge circuit 30 shown in FIG. 2 includes a control circuit 31, and an FET (field effect transistor) 32, a resistor 33, a resistor 34, and an FET 35, which are connected in series. The voltage of the battery 15 is input to the precharge circuit 30 through the vehicle switch 16. Then, the precharge circuit 30 performs duty control of switching operation of the two FETs 32 and 35 to output the voltage between the resistors 33 and 34 as the precharge voltage Vp.

Here, the point to which the precharge circuit 30 outputs the precharge voltage Vp is defined as a P point.

[Configuration of Abnormality Diagnosis Apparatus and Abnormality Diagnosis Method]

For example, Japanese Patent No. 5311233 discloses a motor control apparatus that diagnoses a short-circuit failure and an open failure of a bidirectional power supply relay.

However, in Japanese Patent No. 5311233, the case is not assumed where the capacitor is not charged normally due to failure modes such as a shortage of precharge voltage, disconnection of a precharge path, and a short-circuit failure between the electrodes of the capacitor. Hence, the above failures cannot be diagnosed. In addition, if a failure diagnosis for the bidirectional power supply relay is conduced while the failures are noticed, erroneous determination may be made.

To solve the above problems, after the abnormality diagnosis apparatus 60 of the present embodiment determines that the capacitor 24 is charged normally by the precharge circuit 30, the abnormality diagnosis apparatus 60 can diagnose a failure of the first relay 21 and the second relay 22.

Next, the detailed configuration of the abnormality diagnosis apparatus 60 of the present embodiment and effects thereof will be described in the first embodiment and the second embodiment. The abnormality diagnosis apparatus of the first embodiment is denoted by sign "601", and the abnormality diagnosis apparatus of the second embodiment is denoted by sign "602".

First Embodiment

Figure 3:
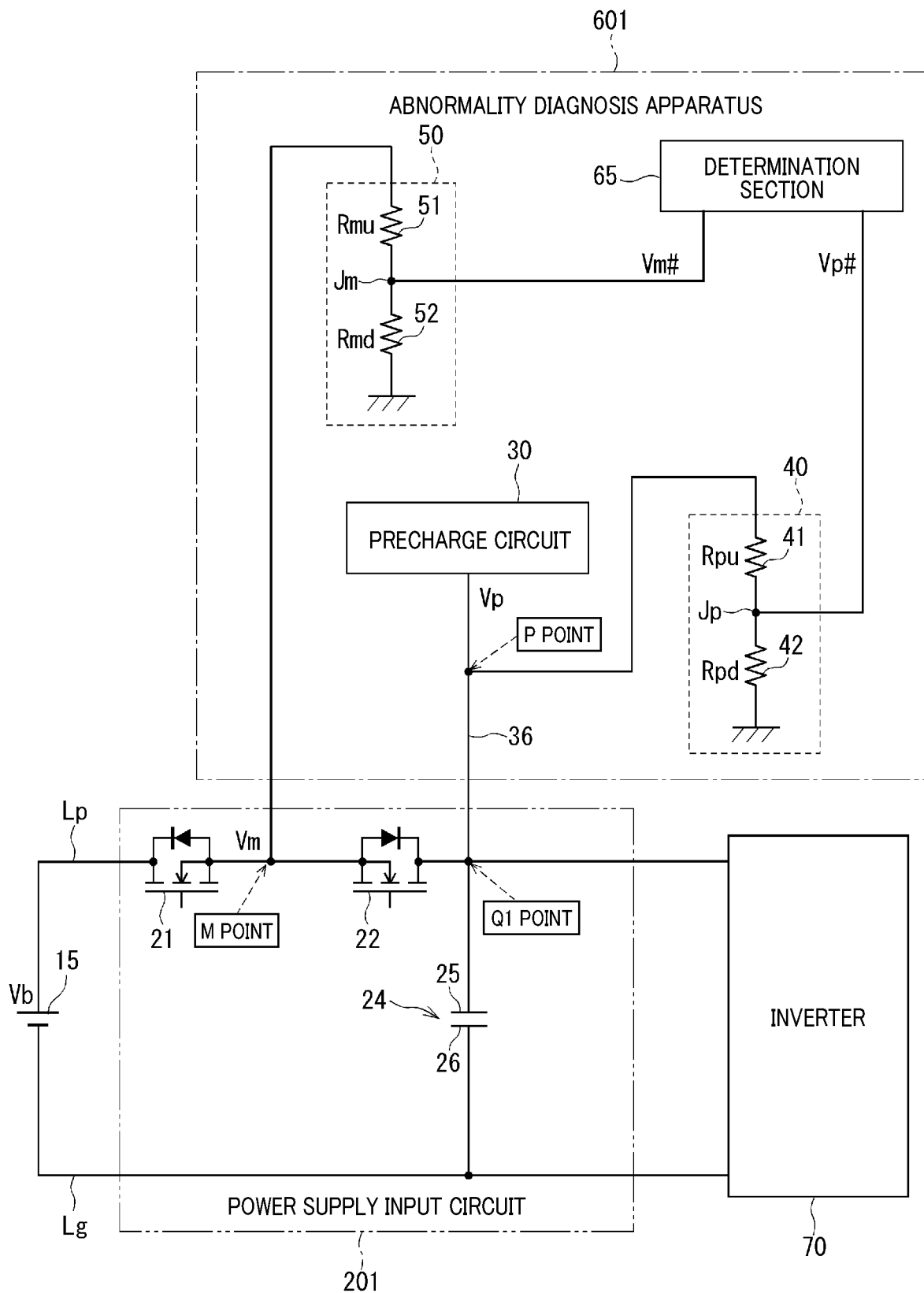
FIG. 3 is diagram showing the configuration of the abnormality diagnosis apparatus of the first embodiment.

The first embodiment will be described with reference to FIG. 3 and FIG. 4.

In the power supply input circuit 201 of the first embodiment, the high potential side electrode 25 of a capacitor 24 is connected to a Q1 point on the power supply line Lp and between the second relay 22 and the inverter 70.

The abnormality diagnosis apparatus 601 includes a precharge circuit 30, a precharge voltage detection circuit 40, an inter-relay voltage detection circuit 50, and a determination section 65.

The precharge circuit 30 is connected to the Q1 point on the power supply line Lp connected with the high potential side electrode 25 of the capacitor 24 via a precharge path 36.

The precharge voltage detection circuit 40 detects a voltage at a P1 point, which is an output portion of the precharge circuit 30. The voltage at the P1 point corresponds to the precharge voltage Vp output from the precharge circuit 30.

In the precharge voltage detection circuit 40 of the present embodiment, an upper side voltage dividing resistor 41 having a resistance value Rpu and a lower side voltage dividing resistor 42 having a resistance value Rpd are connected in series with a connection point Jp being interposed therebetween. The end of the upper side voltage dividing resistor 41 opposite to the connection point Jp is connected to the P point, and the end of the lower side voltage dividing resistor 42 opposite to the connection point Jp is grounded. The precharge voltage detection circuit 40 outputs the voltage at the connection point Jp between the voltage dividing resistors 41 and 42 as a precharge voltage converted value Vp # to the determination section 65.

The inter-relay voltage detection circuit 50 detects an inter-relay voltage Vm at the M point.

In the inter-relay voltage detection circuit 50 of the present embodiment, as in the precharge voltage detection circuit 40, an upper side voltage dividing resistor 51 having a resistance value Rmu and a lower side voltage dividing resistor 52 having a resistance value Rmd are connected in series with a connection point Jm being interposed therebetween. The end of the upper side voltage dividing resistor 51 opposite to the connection point Jm is connected to the M point, and the end of the lower side voltage dividing resistor 52 opposite to the connection point Jm is grounded. The inter-relay voltage detection circuit 50 outputs the voltage at the connection point Jm between the voltage dividing resistors 51 and 52 as an inter-relay voltage converted value Vm # to the determination section 65.

The determination section 65 is typically configured by a microcomputer, and operates by the voltage of the IG line shown in FIG. 2. The determination section 65 performs A/D conversion of voltage signals of the precharge voltage converted value Vp # and the inter-relay voltage converted value Vm # to compare the converted signals with a determination threshold value stored therein, thereby determining an abnormality. The abnormality determination will be described later in detail.

Next, with reference to FIG. 4, the abnormality diagnosis method performed by the abnormality diagnosis apparatus 601 will be described. After the vehicle switch is turned on, the abnormality diagnosis is performed as an initial check before the drive of the motor starts.

The abnormality diagnosis apparatus 601 performs the diagnosis in sequence from the first step. At the time when it is determined that there is an abnormality, the abnormality diagnosis apparatus 601 ends the diagnosis. If it is determined to be normal in each step, the process proceeds to the next step. That is, in each diagnosis step that is the second step or a later step, an abnormality is determined assuming that, regarding the failure modes, it has been normal in the former steps. If it is determined to be normal in the final fifth step, it is determined that, regarding all the failure modes, there is no abnormality.

If an abnormality is determined in any of the steps in the initial check, the motor controller 10 applied to the electric power steering equipment 90, for example, informs other ECUs of the abnormality or issues an alarm about the abnormality to the driver.

In addition, even if it is determined to be normal in all the abnormality diagnoses in the present embodiment, initial checks for parts other than the power supply input circuit 201 such as the switching elements 71 to 76 of the inverter 70, motor windings, and various sensors may be additionally conducted. In that case, after it is determined to be normal in all the parts by the abnormality diagnosis, the motor controller 10 starts to control the drive of the motor 80.

FIG. 4 shows operations of the first relay 21, the second relay 22, and the precharge circuit 30, and determination values and determination conditions of the abnormality determination.

The operation indicates an operation command from the controller and does not indicate actual operation. That is, if the first relay 21, the second relay 22, and the precharge circuit 30 are normal, they operate in accordance with the operation command. However, if they are abnormal, the actual operation does not agree with the operation command. In addition, operating the precharge circuit 30 is denoted by "ON", and not operating the precharge circuit 30 is denoted by "OFF".

In the first and second steps, the precharge voltage converted value Vp # is used as the determination value. In the third to fifth steps, the inter-relay voltage converted value Vm # is used as the determination value.

For reference, theoretical values of the determination values at normal time and abnormal time are shown. The theoretical values are obtained by ignoring the wiring resistance of the circuit and on resistance of the first relay 21 and second relay 22 and assuming that the capacitor 24 does not discharge during the diagnosis. In the actual design, determination threshold values A1 to E1 are set considering the wiring resistance, errors caused due to the discharge, variation in characteristics and the like with respect to the theoretical values. It is noted that, the theoretical values at abnormal time are shown in the left side, and the theoretical values at normal time are shown in the right side so that inequality signs regarding the theoretical values correspond with those of the determination conditions.

Here, a voltage dividing ratio $\alpha p$ of the precharge voltage detection circuit 40, and a voltage dividing ratio $\alpha m$ of the inter-relay voltage detection circuit 50 are defined by the expressions (1) and (2). The voltage dividing ratios $\alpha p$ and $\alpha m$ indicate ratios of a resistance value of lower side voltage dividing resistor to a total resistance value of upper and lower voltage dividing resistance.

$$\alpha p = Rpd/(Rpd+Rpu) \quad (1)$$

$$\alpha m = Rmd/(Rmd+Rmu) \quad (2)$$

In addition, battery voltage Vb is larger than precharge voltage Vp. That is, the relationship Vb>Vp is established. Hereinafter, "·" in "$\alpha p \cdot Vp$" and the like is a multiplication sign.

Next, the process will be described in detail in order of the steps.

<First Step>

In the first step, in the state where the first relay 21 and the second relay 22 are turned off, and the precharge circuit 30 is operated (ON), a shortage of the precharge voltage Vp (insufficient precharge voltage Vp) or a short-circuit failure between the electrodes of the capacitor 24 is diagnosed based on the precharge voltage converted value Vp #.

If a short circuit has not occurred between the electrodes of the capacitor 24, and the precharge circuit 30 operates normally to output the precharge voltage Vp, the precharge voltage converted value Vp # input to the determination section 65 is $\alpha p \cdot Vp$.

In contrast, when a short circuit has occurred between the electrodes of the capacitor 24, the capacitor 24 is not charged, and the precharge voltage converted value Vp # is 0.

In addition, when the precharge circuit 30 does not operate at all, and the precharge voltage Vp is not output, the precharge voltage converted value Vp # is 0. Alternatively, although the precharge circuit 30 operates, when output voltage is lower than that in normal time, the precharge voltage converted value Vp # is larger than 0 and smaller than the value $\alpha p \cdot Vp$ in normal time. Hence, in FIG. 4, the theoretical value in abnormal time is indicated in parentheses as (0).

Hence, if the precharge voltage converted value Vp # is smaller than the determination threshold value A1 set to $\alpha p \cdot Vp$ or less, the determination section 65 determines that there is an abnormality.

<Second Step>

In the second step, in the state where the first relay 21 and the second relay 22 are turned off, and the precharge circuit 30 is not operated (OFF), a disconnection failure of the precharge path 36 is diagnosed based on the precharge voltage converted value Vp #. The disconnection failure of the precharge path 36 includes disconnection of the path and disconnection of a terminal of the end of the path.

If the precharge path 36 is connected normally, the precharge voltage converted value Vp # is kept in the value of the first step, which is $\alpha p \cdot Vp$. When a disconnection failure has occurred in the precharge path 36, ending the operation (OFF) of the precharge circuit 30 makes the output voltage 0, whereby the precharge voltage converted value Vp # becomes 0.

Hence, if the precharge voltage converted value Vp # is smaller than the determination threshold value B1 set to $\alpha p \cdot Vp$ or less, the determination section 65 determines that there is an abnormality.

Hereinafter, the third to fifth steps are collectively referred to as a relay failure diagnosis step.

<Third Step>

In the third step, in the state where the first relay 21 and the second relay 22 are turned off, and the precharge circuit 30 is operated (ON), a short-circuit failure of at least one of the first relay 21 and the second relay 22 is diagnosed based on the inter-relay voltage converted value Vm #. It is noted that theoretical value at abnormal time indicates a value when a short-circuit failure occurs in any one of the first relay 21 and the second relay 22 and the other is normal.

If the first relay 21 and the second relay 22 are turned off normally, the inter-relay voltage Vm does not vary after the first step. Hence, residual voltage before the initial check starts is kept. For example, in the configuration in which the second relay 22 is turned off after discharge from the capacitor 24 is conducted before the drive of the motor stops, the residual voltage is 0. In addition, after the operation of the inverter 70 is stopped, if the voltage at the Q1 point is lower than the inter-relay voltage Vm, a current flows from the M point to the Q1 point through the freewheel diode of the second relay 22, whereby the inter-relay voltage Vm lowers. Hence, it can be considered that the residual voltage when the drive of the motor is stopped is relatively low.

When a short-circuit failure occurs in the first relay 21, since the battery voltage Vb is applied to the M point through the first relay 21, the inter-relay voltage converted value Vm # becomes $\alpha m \cdot Vb$.

When a short-circuit failure occurs in the second relay 22, since the precharge voltage Vp is applied to the M point through the second relay 22, the inter-relay voltage converted value Vm # becomes $\alpha m \cdot Vp$.

Assuming that the residual voltage is relative low, since Vb>Vp is established, $\alpha m \cdot Vb > \alpha m \, Vp$>the residual voltage is established. Hence, if the inter-relay voltage converted value Vm # is larger than the determination threshold value C1 set to the assumed maximum residual voltage or more, the determination section 65 determines that there is an abnormality.

<Fourth Step>

In the fourth step, in the state where the first relay 21 is turned off, the second relay 22 is turned on, and the precharge circuit 30 is operated (ON), an open failure of the second relay 22 is diagnosed based on the inter-relay voltage converted value Vm #.

If the second relay 22 is turned on normally, the inter-relay voltage converted value Vm # becomes $\alpha m \cdot Vp$. If an open failure occurs in the second relay 22, the inter-relay voltage converted value Vm # becomes the residual voltage, which is a normal value in the third step.

Assuming that the residual voltage is relative low, the residual voltage<$\alpha m \cdot Vp$ is established. Hence, if the inter-relay voltage converted value Vm # is smaller than the determination threshold value D1 set to $\alpha m \cdot Vp$ or less, the determination section 65 determines that there is an abnormality.

<Fifth Step>

In the fifth step, in the state where the first relay 21 is turned on, the second relay 22 is turned off, an open failure of the first relay 21 is diagnosed based on the inter-relay voltage converted value Vm #. Since it has been determined that a short-circuit failure is not caused in the second relay 22, the precharge circuit 30 may be operated (ON) or not (OFF).

If the first relay 21 is turned on normally, the inter-relay voltage converted value Vm # becomes $\alpha m \cdot Vb$. If an open failure occurs in the first relay 21, the inter-relay voltage converted value Vm # becomes $\alpha m \cdot Vb$, which is a normal value in the fourth step.

Since $\alpha m \cdot Vp < \alpha m \cdot Vb$ is established, if the inter-relay voltage converted value Vm # is smaller than the determination threshold value E1 set to $\alpha m \cdot Vp$ or less, the determination section 65 determines that there is an abnormality.

As described above, before the relay failure diagnosis, in the first step, the abnormality diagnosis apparatus 601 of the first embodiment diagnoses a shortage of precharge voltage Vp or a short-circuit failure between the electrodes of the capacitor 24. In the second step, the abnormality diagnosis apparatus 601 diagnoses a disconnection failure of the precharge path 36. Hence, the range of the failure modes that can be diagnosed by an initial check becomes wider than that in Japanese Patent No. 5311233, whereby a fail-safe function improves.

In addition, after it is determined that charging the capacitor 24 is conducted normally by the precharge circuit 30 in the first and second steps, the relay failure diagnosis is conducted. Hence, erroneous determination in the relay failure diagnosis can be avoided, whereby the reliability of the initial check is improved.

Second Embodiment

Figure 5:
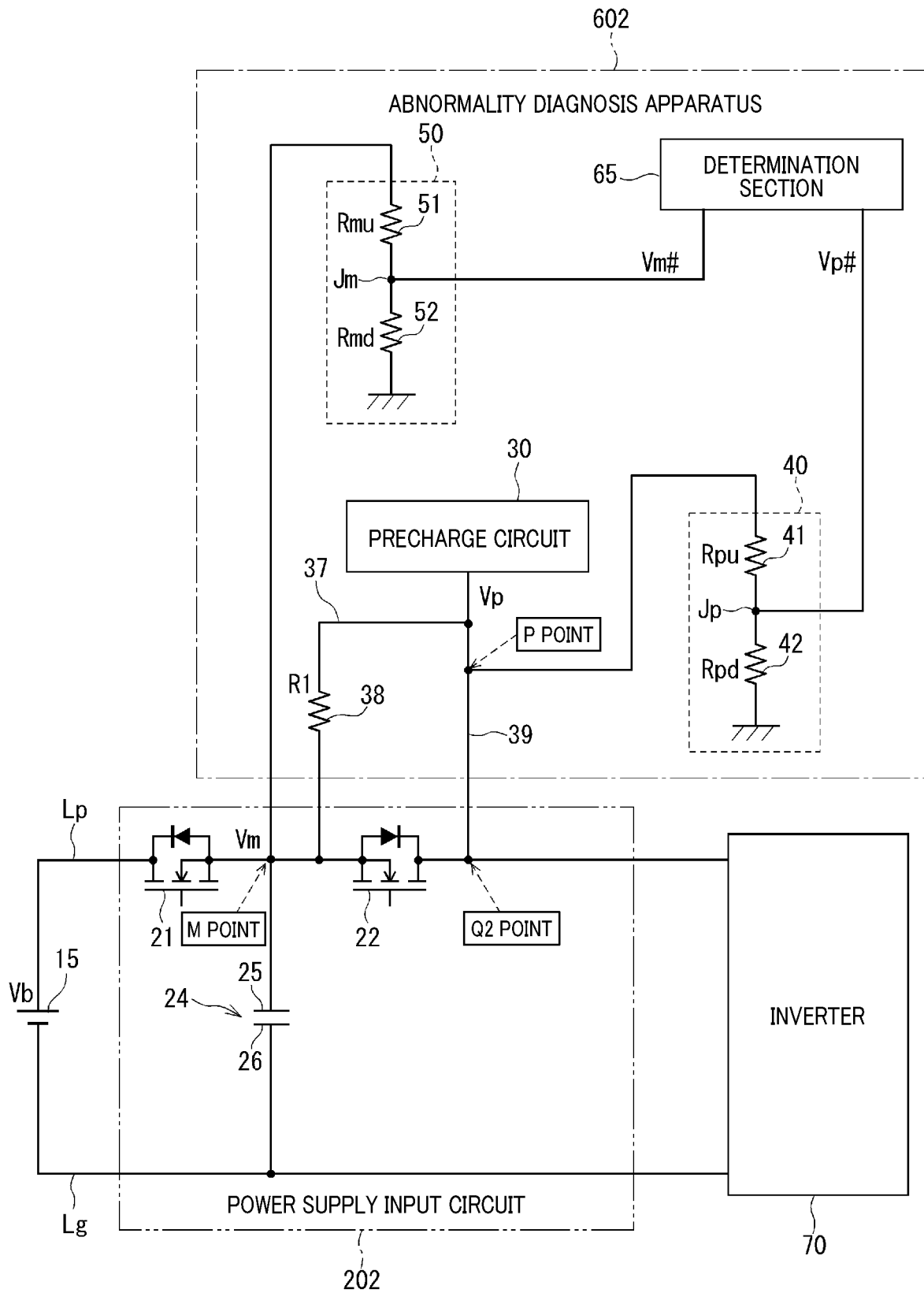
FIG. 5 is diagram showing the configuration of the abnormality diagnosis apparatus of the second embodiment.

The second embodiment will be described with reference to FIG. 5 and FIG. 6. In FIG. 5, the components substantially same as those shown in FIG. 3 of the first embodiment are denoted by the same signs to omit redundant descriptions.

In the power supply input circuit 201 of the second embodiment, the high potential side electrode 25 of the capacitor 24 is connected to the M point on the power supply line Lp and between the first relay 21 and the second relay 22.

The precharge circuit 30 of the abnormality diagnosis apparatus 602 and the M point are connected via a precharge path 37 provided with a precharge resistor 38 having a resistance value R1. In addition, the precharge circuit 30 is connected to a Q2 point on the power supply line Lp and between the second relay 22 and the inverter 70 via a second relay diagnosis path 39.

As in the first embodiment, the precharge voltage detection circuit 40 detects a precharge voltage Vp at the P point, and the inter-relay voltage detection circuit 50 detects an inter-relay voltage Vm at the M point. The determination section 65 determines normality or abnormality regarding the failure modes based on the precharge voltage converted value Vp # and the inter-relay voltage converted value Vm #.

FIG. 6 shows an abnormality diagnosis method performed by the abnormality diagnosis apparatus 602 of the second embodiment. Failure modes diagnosed in the steps and operations of the first relay 21, the second relay 22, and the precharge circuit 30 are the same as those of the first embodiment.

The second embodiment differs from the first embodiment mainly in that the inter-relay voltage converted value Vm is used as a determination value of the second step. In addition, in some steps, theoretical values of the determination values in normal time or abnormal time differ from those in the first embodiment. It is noted that inequality signs between the determination values and the threshold values of the determination conditions are the same as those of the first embodiment. Threshold values A2 to E2 of the steps may be set to the same as the threshold values A1 to E1 in the first embodiment or not.

Here, in addition to the voltage dividing ratios $\alpha p$ and $\alpha m$ defined in the first embodiment, a voltage dividing ratio $\beta m$ of the inter-relay voltage detection circuit 50 including the charge resistor 38 is defined by the expression (3). Since the denominator of $\beta m$ is larger than that of $\alpha m$, and the numerator of $\beta m$ is equal to that of $\alpha m$, the relationship $\alpha m > \beta m$ is established.

$$\beta m = Rmd/(Rmd+Rmu+R1) \qquad (3)$$

In addition, although not shown in FIG. 6, the voltage dividing ratio $\gamma m$ at the M point is defined by the expression (4).

$$\gamma m = (Rmd+Rmu)/(Rmd+Rmu+R1) \qquad (4)$$

Next, the process will be described in detail in order of the steps.

<First Step>

The first step is the same as that of the first embodiment.

<Second Step>

If the precharge path 37 is connected normally, the capacitor 24 is charged in the first step, whereby the inter-relay voltage Vm becomes γm·Vp. Hence, the inter-relay voltage converted value Vm # at normal time is βm·Vp. When a disconnection failure has occurred in the precharge path 37, the inter-relay voltage converted value Vm # is 0.

Hence, if the inter-relay voltage converted value Vm # is smaller than the determination threshold value B2 set to βm·Vp or less, the determination section 65 determines that there is an abnormality.

<Third Step>

If the first relay 21 and the second relay 22 are turned off normally, the inter-relay voltage Vm in the second step is kept. Hence, the inter-relay voltage converted value Vm # at normal time is βm·Vp.

When a short-circuit failure occurs in the first relay 21, since the battery voltage Vb is applied to the M point through the first relay 21, the inter-relay voltage converted value Vm # becomes αm·Vb.

When a short-circuit failure occurs in the second relay 22, since the precharge voltage Vp applied to the Q2 point through the second relay diagnosis path 39 is applied to the M point through the second relay 22, the inter-relay voltage converted value Vm # becomes αm·Vb.

Since αm>βm and Vb>Vp are established, αm·Vb>αm·Vp>βm·Vp is established. Hence, if the inter-relay voltage converted value Vm # is larger than the determination threshold value C2 set to βm·Vp or more, the determination section 65 determines that there is an abnormality.

<Fourth Step>

If the second relay 22 is turned on normally, the inter-relay voltage converted value Vm # is αm·Vb. If an open failure occurs in the second relay 22, the inter-relay voltage converted value Vm # is βm·Vp, which is a normal value in the third step.

Since βm·Vp<αm·Vb is established, if the inter-relay voltage converted value Vm # is smaller than the determination threshold value D2 set to αm·Vb or less, the determination section 65 determines that there is an abnormality.

<Fifth Step>

If the first relay 21 is turned on normally, the inter-relay voltage converted value Vm # is αm·Vb. If an open failure occurs in the first relay 21, the inter-relay voltage converted value Vm # is βm·Vp, which is a normal value in the third step.

Since βm·Vp<αm·Vb is established, if the inter-relay voltage converted value Vm # is smaller than the determination threshold value E2 set to αm·Vb or less, the determination section 65 determines that there is an abnormality.

In the power supply input circuit 202 of the second embodiment, the high potential side electrode 25 of the capacitor 24 is connected to the M point between the relays. Hence, as long as an open failure has not occurred in the second relay 22, the capacitor 24 and the inverter 70 are interrupted when the second relay 22 is in an off state. Thus, when the motor 80 is rotated by external force to generate a counter electromotive voltage, a brake current is prevented from flowing through a current path that starts from the low potential side of the inverter 70 and returns to the high potential side of the inverter 70 via the capacitor 24. Specifically, in the electric power steering equipment 90, since it is likely that a counter electromotive voltage is generated by external force, employing the configuration of the power supply input circuit 202 is effective.

In addition, in the abnormality diagnosis apparatus 602 of the second embodiment, the precharge path 37 is provided with the precharge resistor 38 having the resistance value R1 for the power supply input circuit 202 having the above configuration, whereby the abnormality diagnosis described above can be conducted. Hence, as in the first embodiment, after charging the capacitor 24 by the precharge circuit 30 is diagnosed normally, a failure of the power supply relays 21 and 22 can be determined.

Other Embodiments (a) In the above embodiments, the precharge voltage detection circuit 40 and the inter-relay voltage detection circuit 50 respectively output the precharge voltage converted value Vp # obtained by dividing the voltage at the M point and the inter-relay voltage converted value Vm # obtained by dividing the voltage at the P point to the determination section 65. In another embodiment, voltage values detected by the precharge voltage detection circuit and the inter-relay voltage detection circuit may be output to the determination section without change, and, for example, abnormality determination may be conducted after conversion calculation is performed in the determination section.

As described above, the detection value in the definition "the determination section that determines abnormality based on the detection value of the precharge voltage detection circuit and the detection value of the inter-relay voltage detection circuit" includes the detection value itself and a converted value of the detection value.

(b) In the first step of the above embodiments, as a failure mode based on an abnormality in operation of the precharge circuit 30, the case where output voltage is 0 or the case where the output voltage comes short compared with that in normal time is assumed. In addition to this, a determination threshold value at the upper limit side of the normal range may be set in the first step to determine an abnormality in operation of the precharge circuit 30 in which the output voltage becomes excessive.

It is noted that, in the electric power steering equipment 90, an excessive counter electromotive voltage generated by the motor 80 rotated by external force may be applied to the inverter 70. In this case, determining whether the excessive voltage is based on an abnormality in operation of the precharge circuit 30 is difficult. Hence, in the first step of the above embodiments, the determination value is compared with only the determination threshold values A1 and A2 at the lower limit side of the normal range.

(c) In the first step and the second step of the above embodiments, it is preferable that determination is made when a stable voltage is applied to the determination section 65 and the precharge circuit 30. Hence, the determination may be made when a voltage detection value of the IG line shown in FIG. 2, which is also an operating voltage of the determination section 65, is a predetermined value or more. If the voltage detection value of the IG line is less than the predetermined value, making the determination may wait.

In addition, if making the determination continuously waits for a predetermined time or more, electric charge in the capacitor 24 is discharged, whereby an abnormal state and a normal state may not be distinguished from each other. Hence, after waiting the predetermined time or more in the second step, the determination may be canceled. Then, the process may proceed to the next step.

(d) The specific configuration of the precharge circuit 30 is not limited to the configuration using switching operation of FETs a shown in FIG. 2 and may use a circuit that can operate so as to generate a desired precharge voltage. In other words, a circuit merely lowering input voltage through a fixed resistor is not required. In addition, the power supply of input voltage of the precharge circuit 30 may be other than the battery 15, which is a power supply of the power supply input circuit 20. For example, an independent constant voltage power supply may be used as the precharge circuit 30.

(e) The electrical power converter is not limited to a three-phase AC inverter and may be a four or more multi-phase AC inverter or a DCDC converter.

(f) The Load of the electrical power converter is not limited to a steering assist motor of the electric power steering equipment, but may be a motor for another use or a load other than the motor. Specifically, the abnormality diagnosis apparatus is effective for a system that needs to conduct an initial check for the power supply input circuit, such as a system driving an auxiliary unit for a vehicle.

It will be appreciated that the present invention is not limited to the configurations described above, but any and all modifications, variations or equivalents, which may occur to those who are skilled in the art, should be considered to fall within the scope of the present invention.

Hereinafter, an aspect of the above-described embodiments will be summarized.

As a first aspect of the embodiment, an abnormality diagnosis apparatus is provided which is used for a power supply input circuit (201, 202).

In the power supply input circuit, a first relay (21) connected to the DC power supply side and a second relay (22) connected to the electrical power converter side are connected in series on a power supply line (Lp) that connects a positive electrode of a DC power supply (15) and an electrical power converter (70). The first relay is a switching element having a freewheel diode allowing a current to flow from an electrical power converter side to a DC power supply side. The second relay is a switching element having a freewheel diode allowing a current to flow from the DC power supply side to the electrical power converter side.

In addition, in the power supply input circuit, a high potential side electrode (25) of a capacitor (24) that smooths input voltage of the electrical power converter is connected to the power supply line between the second relay and the electrical power converter or between the first relay and the second relay.

The abnormality diagnosis apparatus includes a precharge circuit (30), a precharge voltage detection circuit (40), an inter-relay voltage detection circuit (50), and a determination section (65).

The precharge circuit can generate a desired precharge voltage (Vp). The precharge circuit is connected to the high potential side electrode of the capacitor via a precharge path (36, 37), and applies the precharge voltage to the high potential side electrode of the capacitor in a state where a path between the DC power supply and the high potential side electrode of the capacitor is interrupted, to charge the capacitor.

The precharge voltage detection circuit detects the precharge voltage output from the precharge circuit.

The inter-relay voltage detection circuit detects an inter-relay voltage (Vm) that is a voltage of the power supply line between the first relay and the second relay.

The determination section determines an abnormality regarding a predetermined failure mode based on a detection value of the precharge voltage detection circuit and a detection value of the inter-relay voltage detection circuit.

The detection value of the precharge voltage detection circuit or the inter-relay voltage detection circuit is not limited to a value of the precharge voltage or the inter-relay voltage and includes a converted value obtained by dividing the precharge voltage or the inter-relay voltage divided by voltage dividing resistance.

The abnormality diagnosis apparatus performs a first step, a second step, and a relay failure diagnosis step.

In the first step, the abnormality diagnosis apparatus diagnoses a shortage of the precharge voltage or a short-circuit failure between electrodes of the capacitor based on the detection value of the precharge voltage detection circuit in a state where the first relay and the second relay are turned off, and the precharge circuit is operated.

In the second step after a normal determination in the first step, the abnormality diagnosis apparatus diagnoses a disconnection failure of the precharge path based on the detection value of the precharge voltage detection circuit or the detection value of the inter-relay voltage detection circuit in a state where the first relay and the second relay are turned off, and the precharge circuit is not operated.

In the relay failure diagnosis step after a normal determination in the second step, the abnormality diagnosis apparatus diagnoses a short-circuit failure and an open failure of the first relay or the second relay.

As described above, before the relay failure diagnosis, in the first step, the abnormality diagnosis apparatus diagnoses a shortage of precharge voltage or a short-circuit failure between the electrodes of the capacitor. In the second step, the abnormality diagnosis apparatus diagnoses a disconnection failure of the precharge path. Hence, the range of the failure modes that can be diagnosed by an initial check becomes wider than that in Japanese Patent No. 5311233, whereby a fail-safe function improves.

In addition, after it is determined that charging the capacitor is conducted normally by the precharge circuit in the first and second steps, the relay failure diagnosis is conducted. Hence, erroneous determination in the relay failure diagnosis can be avoided, whereby the reliability of the initial check is improved.

What is claimed is:

1. An abnormality diagnosis apparatus that is used for a power supply input circuit in which a first relay, which is a switching element having a freewheel diode allowing a current to flow from an electrical power converter side to a DC power supply side and is connected to the DC power supply side, and a second relay, which is a switching element having a freewheel diode allowing a current to flow from the DC power supply side to the electrical power converter side and is connected to the electrical power converter side, are connected in series on a power supply line that connects a positive electrode of a DC power supply and an electrical power converter, and a high potential side electrode of a capacitor that smooths input voltage of the electrical power converter is connected to the power supply line between the second relay and the electrical power converter or between the first relay and the second relay, the apparatus comprising:

a precharge circuit that generates a desired precharge voltage, that is connected to the high potential side electrode of the capacitor via a precharge path, and that applies the precharge voltage to the high potential side electrode of the capacitor in a state where a path between the DC power supply and the high potential side electrode of the capacitor is interrupted, to charge the capacitor;

a precharge voltage detection circuit that detects the precharge voltage output from the precharge circuit;

an inter-relay voltage detection circuit that detects an inter-relay voltage that is a voltage of the power supply line between the first relay and the second relay; and a determination section that determines an abnormality regarding a predetermined failure mode based on a detection value of the precharge voltage detection circuit and a detection value of the inter-relay voltage detection circuit, wherein the apparatus performs:

a first step of diagnosing an shortage of the precharge voltage or a short-circuit failure between electrodes of the capacitor based on the detection value of the precharge voltage detection circuit in a state where the first relay and the second relay are turned off, and the precharge circuit is operated;

a second step of diagnosing, after a normal determination in the first step, a disconnection failure of the precharge path based on the detection value of the precharge voltage detection circuit or the detection value of the inter-relay voltage detection circuit in a state where the first relay and the second relay are turned off, and the precharge circuit is not operated; and a relay failure diagnosis step of diagnosing, after a normal determination in the second step, a short-circuit failure and an open failure of the first relay or the second relay.

2. The abnormality diagnosis apparatus according to claim 1, wherein the high potential side electrode of the capacitor of the power supply input circuit is connected between the second relay and the electrical power converter, and the determination section determines, in the second step, the disconnection failure of the precharge path based on the detection value of the precharge voltage detection circuit.

3. The abnormality diagnosis apparatus according to claim 1, wherein the high potential side electrode of the capacitor of the power supply input circuit is connected between the first relay and the second relay, the precharge path is connected with a precharge resistor, and the determination section determines, in the second step, the disconnection failure of the precharge path based on the detection value of the inter-relay voltage detection circuit calculated based on a resistance value of the precharge resistor and a resistance value of a voltage dividing resistor configuring the inter-relay voltage detection circuit.

* * * * *